(12) United States Patent
Goto et al.

(10) Patent No.: US 12,253,422 B2
(45) Date of Patent: Mar. 18, 2025

(54) STATE ESTIMATION SYSTEM

(71) Applicant: KELK Ltd., Kanagawa (JP)

(72) Inventors: Daisuke Goto, Kanagawa (JP); Takahiro Murase, Kanagawa (JP)

(73) Assignee: KELK Ltd., Kanagawa (JP)

(*) Notice: Subject to any disclaimer, the term of this patent is extended or adjusted under 35 U.S.C. 154(b) by 564 days.

(21) Appl. No.: 17/615,723

(22) PCT Filed: Jun. 4, 2020

(86) PCT No.: PCT/JP2020/022139
§ 371 (c)(1),
(2) Date: Dec. 1, 2021

(87) PCT Pub. No.: WO2020/261921
PCT Pub. Date: Dec. 30, 2020

(65) Prior Publication Data
US 2022/0252462 A1 Aug. 11, 2022

(30) Foreign Application Priority Data
Jun. 28, 2019 (JP) ................. 2019-122385

(51) Int. Cl.
*G01K 3/04* (2006.01)
*G01K 3/06* (2006.01)
*G01K 3/08* (2006.01)
*G01K 7/04* (2006.01)

(52) U.S. Cl.
CPC ............. *G01K 3/06* (2013.01); *G01K 7/04* (2013.01); *G01K 3/08* (2013.01)

(58) Field of Classification Search
CPC .................. G01K 3/06; G01K 7/04
See application file for complete search history.

(56) References Cited

FOREIGN PATENT DOCUMENTS

| | | | | |
|---|---|---|---|---|
| CN | 102741617 A | * | 10/2012 | ........... F24D 10/003 |
| CN | 203358280 U | * | 12/2013 | |
| EP | 3384781 A1 | * | 10/2018 | ............. A23G 9/045 |
| GB | 2017319 A | * | 10/1979 | ............. G01R 21/02 |
| GB | 2332747 A | * | 6/1999 | .......... G01M 99/002 |
| JP | 03152441 A | * | 6/1991 | |
| JP | 06117986 A | * | 4/1994 | |
| JP | 2003150402 | | 5/2003 | |
| JP | 2006061687 A | * | 3/2006 | |
| JP | 3997582 B2 | * | 10/2007 | |
| JP | 2008241648 | | 10/2008 | |
| JP | 2009251488 | | 10/2009 | |
| JP | 2010025747 | | 2/2010 | |
| JP | 2010025747 A | * | 2/2010 | |
| JP | 4422917 B2 | * | 3/2010 | ............. H01J 45/00 |
| JP | 2014219220 | | 11/2014 | |

(Continued)

OTHER PUBLICATIONS

17615723_2024-04-25_GB_2017319_A_H.pdf,Oct. 3, 1979.*

(Continued)

*Primary Examiner* — Gail Kaplan Verbitsky
(74) *Attorney, Agent, or Firm* — Fish & Richardson P.C.

(57) ABSTRACT

A state estimation system includes a thermal load detection unit that detects a thermal load of a device as an object, and an estimation unit that estimates a state of the device on the basis of the thermal load of the device detected by the thermal load detection unit.

5 Claims, 7 Drawing Sheets

(56) References Cited

FOREIGN PATENT DOCUMENTS

| | | | | |
|---|---|---|---|---|
| JP | 2016109544 | | 6/2016 | |
| JP | 6383156 B2 | * | 8/2018 | |
| JP | 2024019770 A | * | 2/2024 | |
| KR | 1465387 B1 | * | 11/2014 | ............ G01N 25/72 |
| WO | WO-02103830 A1 | * | 12/2002 | ............ F02G 5/04 |
| WO | WO-2010023044 A1 | * | 3/2010 | ............ H02J 7/345 |

OTHER PUBLICATIONS

17615723_2024-04-25_GB_2332747_A_H.pdf,Jun. 30, 1999.*
17615723_2024-04-25_JP_03152441_A_H.pdf,Jun. 28, 1991.*
17615723_2024-04-25_JP_06117986_A_H.pdf,Apr. 28, 1994.*
17615723_2024-04-25_JP_2010025747_A_H.pdf,Feb. 4, 2010.*
17615723_2024-04-25_KR_1465387_B1_H.pdf,Nov. 25, 2014.*
17615723_2024-04-26_EP_3384781_A1_H.pdf,Oct. 10, 2018.*
17615723_2024-04-26_JP_2006061687_A_H.pdf,Mar. 9, 2006.*
17615723_2024-04-26_JP_2024019770_A_H.pdf,Feb. 14, 2024.*
17615723_2024-11-22_CN_102741617_A_H.pdf,Oct. 17, 2012.*
17615723_2024-11-22_CN_203358280_U_H.pdf,Dec. 25, 2013.*
17615723_2024-11-22_WO_2010023044_A1_H.pdf,Mar. 4, 2010.*
17615723_2024-11-25_JP_4422917_B2_H.pdf,Mar. 3, 2010.*
17615723_2024-11-25_WO_02103830_A1_H.pdf,Dec. 27, 2002.*
17615723_2024-11-25_JP_3997582_B2_H.pdf,Oct. 24, 2007.*
17615723_2024-11-25_JP_6383156_B2_H.pdf,Aug. 29, 2018.*

* cited by examiner

STATE ESTIMATION SYSTEM

CROSS-REFERENCE TO RELATED APPLICATIONS

This application is a National Stage application of International Application No. PCT/JP2020/022139, filed on Jun. 4, 2020, which claims priority to Japanese Patent Application No. 2019-122385, filed on Jun. 28, 2019. The contents of the prior applications are incorporated herein in their entirety.

FIELD

The present invention relates to a state estimation system.

BACKGROUND

For example, there is known a technique for estimating a maintenance timing of an object such as a device installed in a construction machine or factory equipment on the basis of integration of an energization time or an operating time of the object. Further, an integrated calorimeter used for a cooling and heating system of a building or the like is known, which calculates and integrates a heat quantity to grasp a variation state of heat consumption (see, for example, Patent Literature 1). Furthermore, there is known a technique for calculating a replacement time of a consumable part with information regarding an accumulated use time, temperature, humidity, and illuminance (see, for example, Patent Literature 2).

CITATION LIST

Patent Literature

Patent Literature 1: JP 2016-109544 A
Patent Literature 2: JP 2009-251488 A

SUMMARY

Technical Problem

When a state of an object including a maintenance timing is estimated on the basis of integration of energization time or operating time of the object, a state of a load for each object is not reflected, and thus it may be difficult to accurately estimate the state. Therefore, it is desirable to appropriately estimate the state of the object.

An object of an aspect of the present invention is to appropriately estimate a state of an object.

Solution to Problem

According to an aspect of the present invention, a state estimation system comprises: a thermal load detection unit that detects a thermal load of an object; and an estimation unit that estimates a state of the object on a basis of the thermal load of the object detected by the thermal load detection unit.

Advantageous Effects of Invention

According to an aspect of the present invention, a state of an object can be appropriately estimated.

DESCRIPTION OF EMBODIMENTS

Hereinafter, an embodiment according to the present invention will be described with reference to the drawings, but the present invention is not limited thereto. Components of the embodiments described below can be appropriately combined. Further, some components may not be used.

First Embodiment

<State Estimation System>

Figure 1:
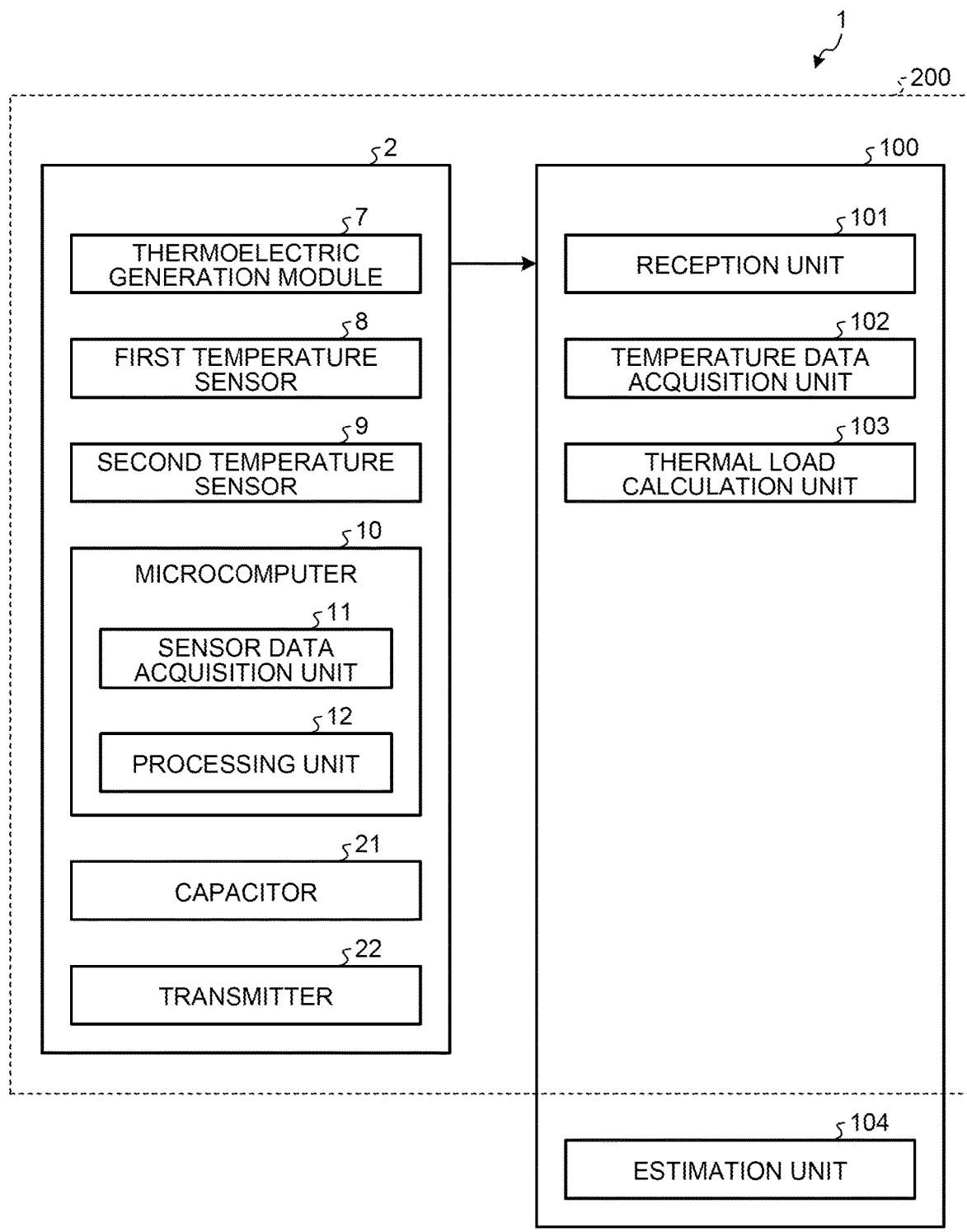
FIG. 1 is a block diagram illustrating a state estimation system according to a first embodiment.

FIG. 1 is a block diagram illustrating a state estimation system 1 according to a first embodiment. The state estimation system 1 estimates a state of an object such as a device M (see FIG. 2) installed in a construction machine or factory equipment, for example. As the state of the object, for example, a maintenance timing such as whether or not the object is in a state that maintenance is performed is estimated. The state of the object may be estimated stepwise according to the degree of deterioration of the object, for example. The device M is, for example, a device that generates heat during operation, including a motor or a gear. As illustrated in FIG. 1, the state estimation system 1 includes a thermoelectric generation device 2 and a management computer 100 existing outside the thermoelectric generation device 2.

<Thermoelectric Generation Device>

Figure 2:
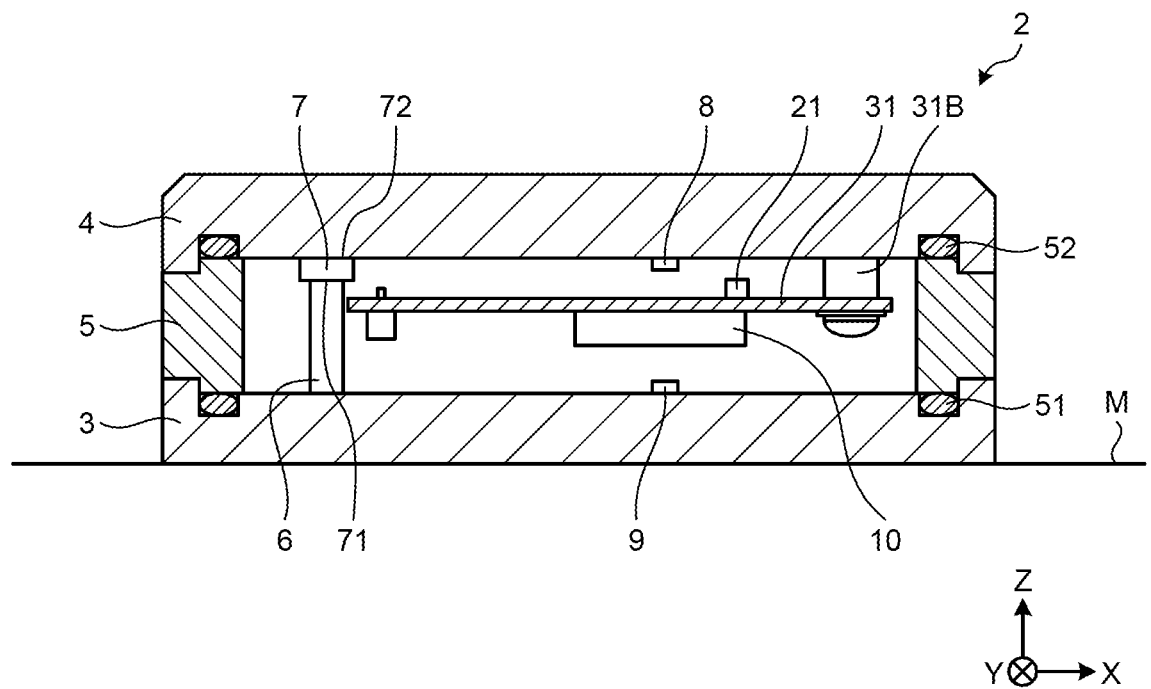
FIG. 2 is a sectional view illustrating a thermoelectric generation device.

FIG. 2 is a sectional view illustrating the thermoelectric generation device 2. The thermoelectric generation device 2 is disposed in, for example, the device M disposed in a construction machine or factory equipment. The thermoelectric generation device 2 detects a temperature of the device M, and transmits a signal indicating the detected temperature to the outside by a radio wave. The device M functions as a heat source of the thermoelectric generation device 2.

As illustrated in FIG. 2, the thermoelectric generation device 2 includes a heat reception plate 3, a heat sink 4, a wall part 5, a heat transfer member 6, a thermoelectric generation module 7, a first temperature sensor 8, a second temperature sensor 9, a microcomputer 10, a capacitor (power storage unit) 21, a transmitter (transmission unit) 22 (see FIG. 1), and a substrate 31. The thermoelectric generation device 2 functions as a thermal load detection unit 200 that detects a thermal load of the device M together with a temperature data acquisition unit 102 and a thermal load calculation unit 103 of the management computer 100 described later. In the present embodiment, the thermal load detection unit 200 detects an integrated amount of a temperature difference ΔT between the temperature of the device M and a temperature around the device M as a thermal load.

The heat reception plate 3 is disposed in the device M. The heat reception plate 3 is a plate-shaped member. The heat reception plate 3 is formed of, for example, a metal material containing aluminum or copper. The heat reception plate 3 receives heat from the device M. Heat of the heat reception plate 3 is conducted to the thermoelectric generation module 7 via the heat transfer member 6.

The heat sink 4 faces the heat reception plate 3 in a Z-axis direction and is disposed apart from the heat reception plate 3. The heat sink 4 is a plate-like member. The heat sink 4 is formed of, for example, a metal material containing aluminum or copper. The heat sink 4 receives heat from the thermoelectric generation module 7. Heat of the heat sink 4 is radiated to an atmospheric space around the thermoelectric generation device 2.

The wall part 5 has a rectangular tube shape as viewed in the Z axis direction. The wall part 5 is disposed to surround the heat reception plate 3 and the heat sink 4. The wall part 5, the heat reception plate 3, and the heat sink 4 form a box shape having a space therein. The wall part 5 is formed of a synthetic resin material having heat insulation properties and radio wave transparency.

A seal member 51 is disposed at a connection portion between a peripheral edge portion of the heat reception plate 3 and an end portion on a −Z side of the wall part 5. A seal member 52 is disposed at a connection portion between a peripheral edge portion of the heat sink 4 and an end portion on a +Z side of the wall part 5. The seal member 51 and the seal member 52 include, for example, an O-ring. The seal member 51 and the seal member 52 seal the thermoelectric generation device 2. Thus, entry of foreign matter into the thermoelectric generation device 2 is restricted.

The heat transfer member 6 is erected from the heat reception plate 3 toward the +Z side. The heat transfer member 6 connects the heat reception plate 3 and the thermoelectric generation module 7. The heat transfer member 6 conducts heat of the heat reception plate 3 to the thermoelectric generation module 7. The heat transfer member 6 is formed of, for example, a metal material containing aluminum or copper. The heat transfer member 6 has a columnar shape elongated in the Z-axis direction.

The thermoelectric generation module 7 generates electric power using the Seebeck effect. The thermoelectric generation module 7 is disposed on the heat sink 4. When an end face 71 on the −Z side of the thermoelectric generation module 7 is heated by the heat source, a temperature difference is generated between −Z-side end face 71 and an end face 72 on the +Z side of the thermoelectric generation module 7. The thermoelectric generation module 7 generates electric power by a temperature difference generated between the end face 71 and the end face 72. The thermoelectric generation module 7 may be disposed on the heat reception plate 3. A detailed configuration of the thermoelectric generation module 7 will be described later.

The first temperature sensor 8 is disposed on the heat sink 4. The first temperature sensor 8 detects a temperature around the device M. The first temperature sensor 8 is driven by electric power generated by the thermoelectric generation module 7.

The second temperature sensor 9 is disposed on the heat reception plate 3. The second temperature sensor 9 detects the temperature of the device M. The second temperature sensor 9 is driven by electric power generated by the thermoelectric generation module 7.

The capacitor 21 stores electric charge generated from the thermoelectric generation module 7. When the stored electric power exceeds a predetermined amount, the capacitor 21 drives the first temperature sensor 8 and the second temperature sensor 9, the microcomputer 10, and the transmitter 22.

The transmitter 22 wirelessly transmits a transmission signal based on detection data of the first temperature sensor 8 and the second temperature sensor 9. The transmitter 22 is driven by electric power generated by the thermoelectric generation module 7. The transmitter 22 is driven by the discharge from the capacitor 21. The transmitter 22 is disposed on the substrate 31.

The transmitter 22 transmits a transmission signal generated by the processing unit 12 of the microcomputer 10 and based on the detection data of the first temperature sensor 8 and the second temperature sensor 9 to the management computer 100 at every predetermined time interval. The predetermined time is, for example, approximately several 10 seconds.

Alternatively, the transmitter 22 may transmit the transmission signal based on the detection data to the management computer 100 every time the electric power stored in the capacitor 21 exceeds a predetermined amount.

The substrate 31 includes a control substrate. The substrate 31 is disposed between the heat reception plate 3 and the heat sink 4. The substrate 31 is connected to the heat sink 4 via the support member 31B.

<Microcomputer>

Returning to FIG. 1, the microcomputer 10 controls the thermoelectric generation device 2. The microcomputer 10 is driven by electric power generated by the thermoelectric generation module 7. The microcomputer 10 includes a detection data acquisition unit 11 and a processing unit 12. The microcomputer 10 is disposed on the substrate 31.

The detection data acquisition unit 11 acquires detection data of the first temperature sensor 8 and the second temperature sensor 9. The detection data of the first temperature sensor 8 and the second temperature sensor 9 acquired by the detection data acquisition unit 11 is processed by the processing unit 12 and transmitted to the management computer 100 by the transmitter 22.

The processing unit 12 generates a transmission signal to be transmitted to the management computer 100 on the basis of the detection data acquired by the detection data acquisition unit 11. In the present embodiment, the processing unit 12 generates a transmission signal indicating a temperature difference ΔT between a temperature of the heat reception plate 3 detected by the second temperature sensor 9 and a temperature of the heat sink 4 detected by the first temperature sensor 8 on the basis of the detection data acquired by the detection data acquisition unit 11. The generated transmission signal is transmitted to the management computer 100 via the transmitter 22.

ΔT is expressed by following Equation 1. Th is the temperature of the heat reception plate 3 of the thermoelectric generation module 7 detected by the second temperature sensor 9. Tc is the temperature of the heat sink 4 detected by the first temperature sensor 8.

$$\Delta T = Th - Tc \qquad (1)$$

<Operation of Thermoelectric Generation Device>

An example of operation of the thermoelectric generation device 2 configured as described above will be described.

The thermoelectric generation device 2 operates while the state estimation system 1 is activated.

When the device M is driven, the device M generates heat. The heat of the device M is conducted to the thermoelectric generation module 7 via the heat reception plate 3 and the heat transfer member 6. The thermoelectric generation module 7 that has received the heat generates power by the temperature difference generated between the end face 71 and the end face 72. The electric power generated by the thermoelectric generation module 7 drives the first temperature sensor 8, the second temperature sensor 9, the microcomputer 10, and the transmitter 22. The first temperature sensor 8 detects a temperature around the device M. The second temperature sensor 9 detects the temperature of the device M. The microcomputer 10 causes the detection data acquisition unit 11 to acquire detection data from the first temperature sensor 8 and the second temperature sensor 9. The microcomputer 10 causes the processing unit 12 to generate a transmission signal indicating the temperature difference ΔT based on the detection data of the first temperature sensor 8 and the second temperature sensor 9. The transmitter 22 transmits the transmission signal indicating the temperature difference ΔT to the management computer 100.

<Management Computer>

The management computer 100 is disposed outside the thermoelectric generation device 2, for example, in a management center where a state of a construction machine or factory equipment including a state of the device M is managed. The management computer 100 includes a reception unit 101, a temperature data acquisition unit 102, a thermal load calculation unit 103, and an estimation unit 104. The temperature data acquisition unit 102 and the thermal load calculation unit 103 of the management computer 100 function as the thermal load detection unit 200 together with the thermoelectric generation device 2.

The reception unit 101 wirelessly receives data from the thermoelectric generation device 2.

The temperature data acquisition unit 102 acquires temperature data regarding the device M from the thermoelectric generation device 2. More specifically, the temperature data acquisition unit 102 acquires the transmission signal based on the detection data of the first temperature sensor 8 and the second temperature sensor 9 from the transmitter 22 of the thermoelectric generation device 2 via the reception unit 101.

The thermal load calculation unit 103 calculates the thermal load of the device M. In the present embodiment, the thermal load calculation unit 103 calculates the thermal load of the device M from a transmission signal based on the detection data indicating the temperature of the device M acquired by the temperature data acquisition unit 102. More specifically, the thermal load calculation unit 103 calculates the integrated amount of the temperature difference ΔT as the thermal load of the device M on the basis of the transmission signal indicating the temperature difference ΔT between the temperature of the heat reception plate 3 detected by the second temperature sensor 9 of the thermoelectric generation device 2 and the temperature of the heat sink 4 detected by the first temperature sensor 8, which are acquired by the temperature data acquisition unit 102.

The thermal load calculation unit 103 may calculate the integrated amount of the temperature difference ΔT by integrating output values transmitted from the thermoelectric generation device 2, and may use the integrated amount as the thermal load of the device M.

By integrating the temperature difference ΔT, not a simple operating time of the device M but an operating time in consideration of an operation load of the device M is calculated as a thermal load of the device M.

Figure 3:
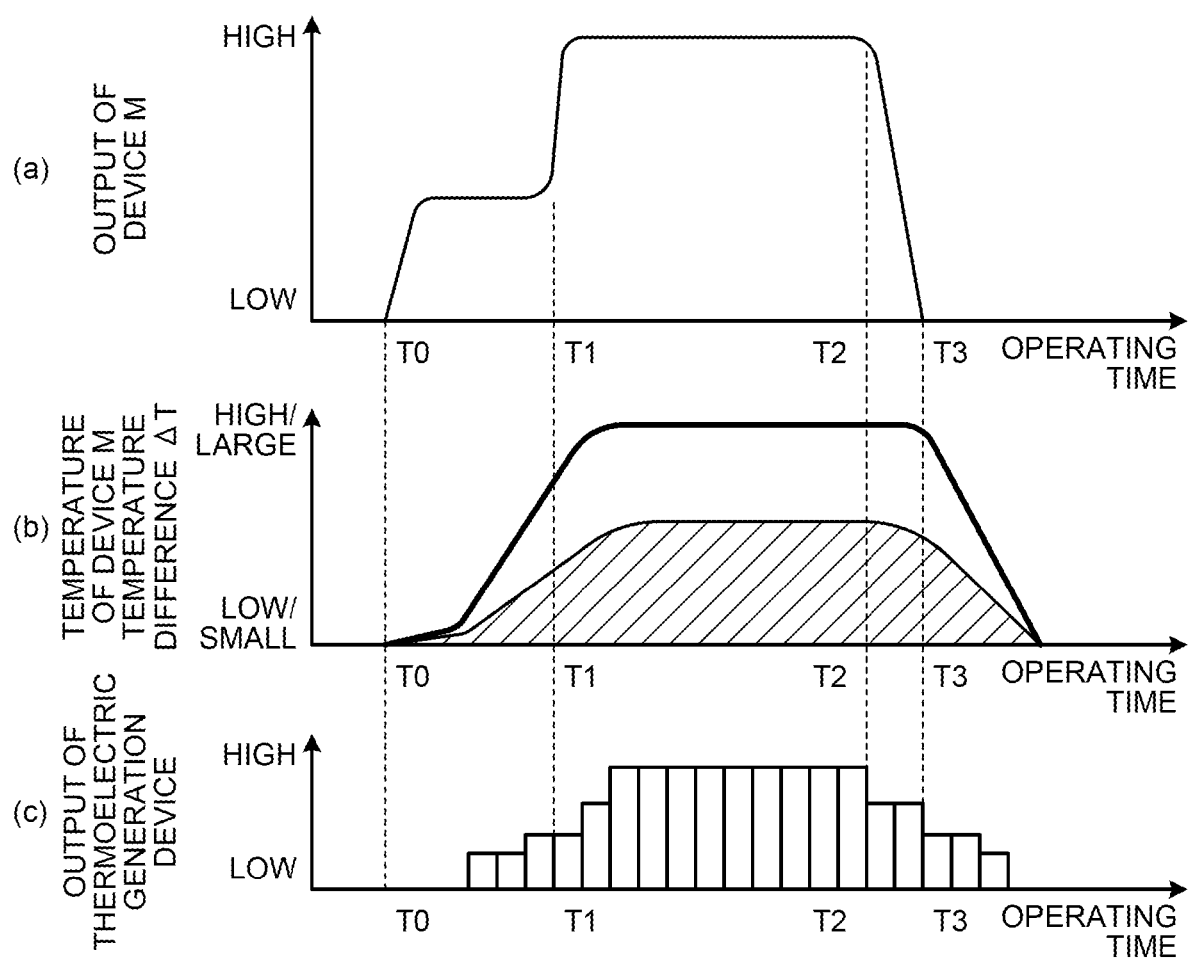
FIG. 3 is a diagram describing a correlation between an output of a device and a temperature difference between the device and surroundings.

FIG. 3 is a diagram describing a correlation between an output of the device M and temperatures of the device M and the surroundings. FIG. 3(a) illustrates the output from a start to a stop of the device M. As illustrated in FIG. 3(a), the device M starts at time T0, has a constant output from time T1 to time T2, starts a stop operation at time T2, and stops at time T3. In FIG. 3(b), the temperature of the device M as a heat source is indicated by a thick solid line, and the temperature difference ΔT between the temperature of the device M and the temperature around the device M is indicated by a solid line. The area of a region surrounded by the solid line indicating the temperature difference ΔT and a horizontal axis indicates the integrated amount of the temperature difference ΔT. As illustrated in FIG. 3(b), the temperature of the device M changes according to the output of the device M, in other words, the operation load of the device M. The temperature difference ΔT changes according to the temperature of the device M. FIG. 3(c) illustrates an output of the transmission signal indicating the temperature difference ΔT output from the thermoelectric generation device 2. As illustrated in FIG. 3(c), the transmission signal indicating the temperature difference ΔT, which is the output from the thermoelectric generation device 2, is transmitted at predetermined time intervals.

The estimation unit 104 estimates the state of the device M on the basis of the thermal load of the device M detected by the thermal load detection unit 200. More specifically, the estimation unit 104 estimates the state of the device M on the basis of the thermal load of the device M calculated by the thermal load calculation unit 103. In the present embodiment, the estimation unit 104 estimates the state of the device M on the basis of the integrated amount of the temperature difference ΔT as the thermal load calculated by the thermal load calculation unit 103. The state of the device M may be estimated as good or bad, or the state may be estimated in stages.

For example, in a case where the integrated amount of the temperature difference ΔT is equal to or more than a threshold, the estimation unit 104 estimates that the state of the device M is "defective" requiring an inspection, and in a case where the integrated amount of the temperature difference ΔT is less than the threshold, the estimation unit 104 estimates that the state of the device M is "good" not requiring the inspection.

For example, the estimation unit 104 estimates the state of the device M as "caution" that does not require inspection when the integrated amount of the temperature difference ΔT is equal to or larger than a first threshold, estimates the state of the device M as "inspection required" that requires the inspection when the integrated amount of the temperature difference ΔT is equal to or larger than a second threshold larger than the first threshold, and estimates the state of the device M as "replacement required" that requires replacement when the integrated amount of the temperature difference ΔT is equal to or larger than a third threshold larger than the second threshold. When the integrated amount of the temperature difference ΔT is less than the first threshold, the estimation unit 104 estimates that the state of the device M is "good" in which no inspection is required.

Furthermore, the estimation unit 104 may estimate the state of the device M on the basis of the operating time of the device M in addition to the integrated amount of the temperature difference ΔT. For example, in a case where the integrated amount of the temperature difference ΔT is equal to or more than the threshold and the operating time of the device M is equal to or more than an operable time, the estimation unit 104 may estimate that the state of the device M is "defective" that requires inspection.

Figure 4:
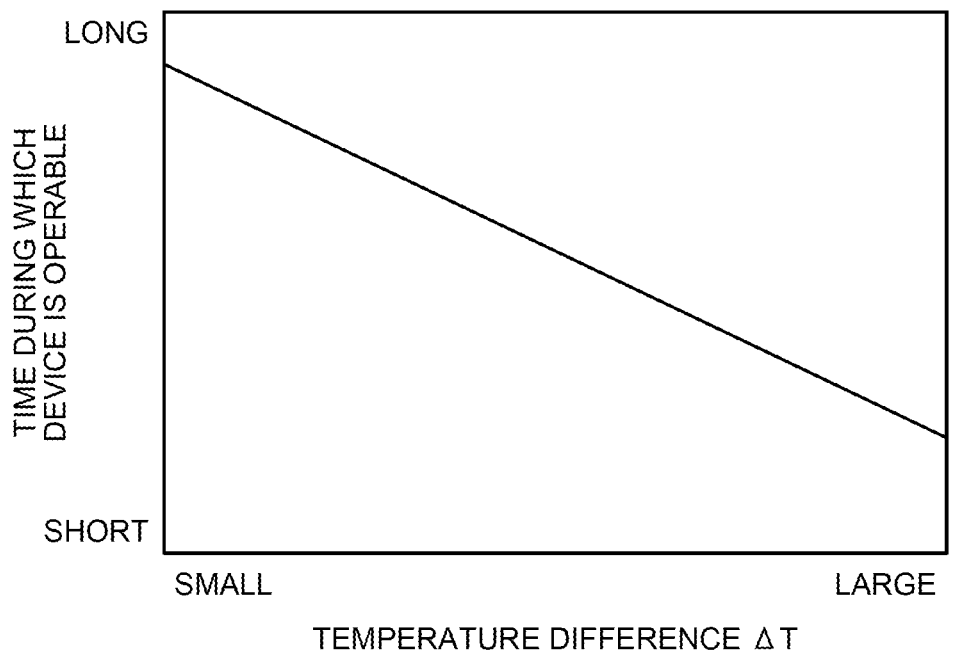
FIG. 4 is a diagram describing a correlation between a temperature difference between a device and surroundings and a time during which the device is operable.

FIG. 4 is a diagram describing a correlation between the temperature difference ΔT and the operable time of the device M. FIG. 4 illustrates that the larger the temperature difference ΔT, the shorter the operable time of the device M. This is because the operation load of the device M increases as the temperature difference ΔT increases.

<Processing of Management Computer>

Figure 5:
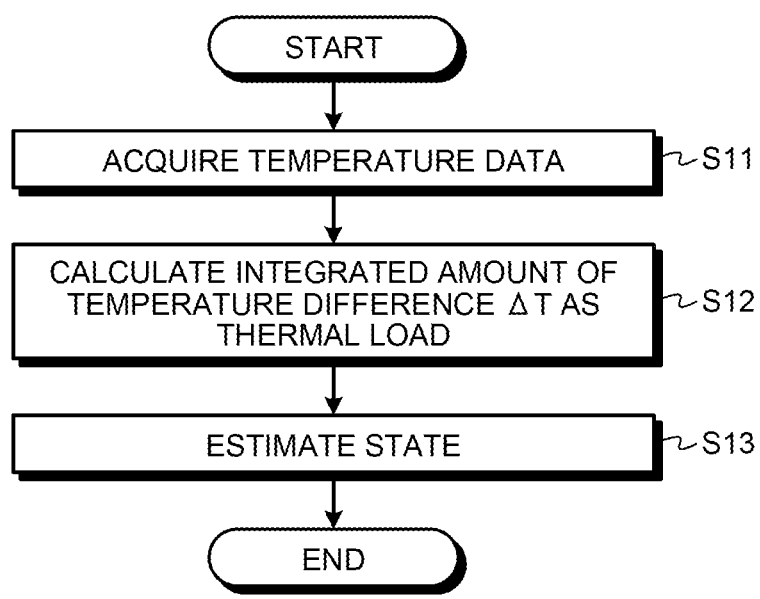
FIG. 5 is a flowchart illustrating an example of processing in a management computer of the state estimation system according to the first embodiment.

Next, an example of processing of the management computer 100 will be described with reference to FIG. 5. FIG. 5 is a flowchart illustrating an example of processing in the management computer 100 of the state estimation system 1 according to the first embodiment. The management computer 100 operates while the state estimation system 1 is activated.

In the management computer 100, the temperature data acquisition unit 102 acquires temperature data via the reception unit 101 (step S11). More specifically, the management computer 100 causes the temperature data acquisition unit 102 to acquire a transmission signal based on the detection data of the first temperature sensor 8 and the second temperature sensor 9 from the thermoelectric generation device 2 via the reception unit 101. In the present embodiment, the signal indicating the temperature difference ΔT between the temperature of the heat reception plate 3 detected by the second temperature sensor 9 and the temperature of the heat sink 4 detected by the first temperature sensor 8 is acquired as the transmission signal. The management computer 100 proceeds to step S12.

The management computer 100 calculates, by the thermal load calculation unit 103, the integrated amount of the temperature difference ΔT as the thermal load of the device M (step S12). More specifically, by the thermal load calculation unit 103, the integrated amount of the temperature difference ΔT is calculated as the thermal load of the device M on the basis of the transmission signal indicating the temperature difference ΔT between the temperature of the heat reception plate 3 detected by the second temperature sensor 9 and the temperature of the heat sink 4 detected by the first temperature sensor 8. The management computer 100 proceeds to step S13.

The management computer 100 causes the estimation unit 104 to estimate the state of the device M on the basis of the integrated amount of the temperature difference ΔT calculated by the thermal load calculation unit 103 (step S13).

<Effects>

As described above, the present embodiment includes the first temperature sensor 8 and the second temperature sensor 9 of the thermoelectric generation device 2 that detect the temperature of the device M, and the thermal load calculation unit 103 of the management computer 100, which function as the thermal load detection unit 200. The present embodiment includes the estimation unit 104 that estimates the state of the device M on the basis of the thermal load of the device M calculated by the thermal load calculation unit 103. According to the present embodiment, the state of the device M can be appropriately estimated on the basis of the thermal load of the device M. According to the present embodiment, a maintenance timing can be appropriately estimated for each device M.

In the present embodiment, the thermal load calculation unit 103 calculates, as a thermal load, an integrated amount of a temperature difference ΔT between the temperature of the heat reception plate 3 detected by the second temperature sensor 9 and the temperature of the heat sink 4 detected by the first temperature sensor 8. According to the present embodiment, it is possible to appropriately estimate the state of the device M not by the simple operating time of the device M but by the operating time in consideration of the operation load of the device M.

In the present embodiment, for example, when a rapid temperature change occurs in the device M, the temperature difference ΔT also changes rapidly. Thus, according to the present embodiment, even when a rapid temperature change occurs in the device M, the state of the device M can be appropriately estimated. In the present embodiment, the state of the device M can be appropriately estimated according to the state of the load of the device M.

In the present embodiment, the thermoelectric generation device 2 disposed in the device M detects the temperature in the device M and transmits detected detection data. In the present embodiment, the thermoelectric generation module 7 generates electric power by heat generated by the device M. In the present embodiment, a temperature sensor driven by the thermoelectric generation module 7 detects a temperature. Further, in the present embodiment, the transmitter 22 driven by the thermoelectric generation module 7 wirelessly transmits a transmission signal based on detection data of the temperature sensor. According to the present embodiment, in the detection of the temperature in the device M and the transmission of the detected detection data, a power source and a battery can be made unnecessary, and a cable for transmitting the detection data can also be made unnecessary. Unlike the battery-type temperature sensor, the present embodiment can appropriately acquire the detection data without increasing intervals of temperature detection or decreasing a transmission frequency of the detection data in order to secure the usable time of the battery. Further, according to the present embodiment, the installation location is not limited, and it is possible to be applied to various devices M at various installation locations.

In the present embodiment, when the thermoelectric generation device 2 is disposed in the device M, a transmission signal based on the detection data of the first temperature sensor 8 and the second temperature sensor 9 is transmitted to the management computer 100. In the present embodiment, the management computer 100 can appropriately estimate the state of the device M on the basis of the received detection data.

Further, in a case where a plurality of devices M exists, the management computer 100 can estimate states of the plurality of devices M only by disposing the thermoelectric generation device 2 in each of the plurality of devices M.

Second Embodiment

Figure 6:
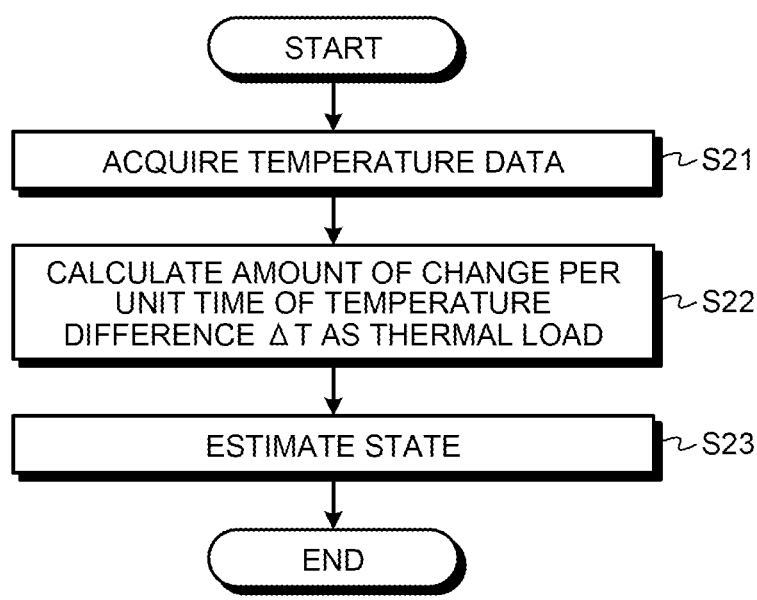
FIG. 6 is a flowchart illustrating an example of processing in a management computer of a state estimation system according to a second embodiment.

FIG. 6 is a flowchart illustrating an example of processing in the management computer 100 of the state estimation system 1 according to the second embodiment. In the following description, the same or equivalent components as those of the above-described embodiment are denoted by the same reference numerals, and the description thereof will be simplified or omitted. The second embodiment is different from the first embodiment in processing in the thermal load calculation unit 103 and the estimation unit 104 of the management computer 100. In the present embodiment, the thermal load detection unit 200 detects, as a thermal load, an amount of change per unit time of the temperature difference ΔT between the temperature of the device M and the temperature around the device M.

<Management Computer>

The thermal load calculation unit 103 calculates, as a thermal load, an amount of change per unit time of the temperature difference ΔT between the temperature of the heat reception plate 3 detected by the second temperature sensor 9 and the temperature of the heat sink 4 detected by the first temperature sensor 8, in other words, a gradient of the temperature difference ΔT.

The thermal load calculation unit 103 may calculate the gradient of the temperature difference ΔT on the basis of output values transmitted from the thermoelectric generation device 2. The difference between the output values plotted in FIG. 3(c) is the gradient of the temperature difference ΔT.

The estimation unit 104 estimates the state of the device M on the basis of the amount of change per unit time of the temperature difference ΔT.

TABLE 1

Environmental temperature and ΔT Unit: ° C.

|  | Morning | Afternoon | Evening |
|---|---|---|---|
| Ta | 20 | 35 | 30 |
| Tc | 22 | 37 | 32 |
| Th | 30 | 45 | 40 |
| ΔT | 8 | 8 | 8 |

The "robustness" of the temperature difference ΔT will be described with reference to Table 1. Table 1 presents environmental temperatures and the temperature difference ΔT. Ta is an environmental temperature indicating a temperature around a construction machine or factory equipment in which the device M is installed. Tc is the temperature of the heat sink 4 detected by the first temperature sensor 8. Th is the temperature of the heat reception plate 3 of the thermoelectric generation module 7 detected by the second temperature sensor 9. The environmental temperature Ta is not always constant, and the temperature changes in one day. Each of Tc and Th changes in temperature in accordance with a change in output of the device M in addition to a change in temperature of the environmental temperature Ta. In the example illustrated in Table 1, the temperature difference ΔT, which is a difference between Th and Tc, is always constant at 8° C. As described above, the temperature difference ΔT, which is the difference between Th and Tc, has "robustness" to become constant regardless of the ambient temperature.

When the output of the device M increases or decreases and only the device M changes in temperature, the temperature difference ΔT changes and the gradient of the temperature difference ΔT changes. When a change occurs in the temperature difference ΔT and a change occurs in the gradient of the temperature difference ΔT beyond an allowable range, it is estimated that a problem occurs in the device M and the entire system including the device M and appears as a temperature change of the device M.

For example, when the amount of change per unit time of the temperature difference ΔT is equal to or greater than a threshold, the estimation unit estimates the state of the device M to be "defective (there is a rapid temperature change)", and when the amount of change per unit time of the temperature difference ΔT is less than the threshold, the estimation unit 104 estimates the state of the device M to be "good".

<Processing of Management Computer>

Next, an example of processing of the management computer 100 will be described with reference to FIG. 6. In step S21, processing similar to that in step S11 of the flowchart illustrated in FIG. 5 is performed.

The management computer 100 calculates, by the thermal load calculation unit 103, the amount of change per unit time of the temperature difference ΔT as the thermal load of the device M (step S22). More specifically, by the thermal load calculation unit 103, the amount of change per unit time of the temperature difference ΔT is calculated as the thermal load of the device M on the basis of the transmission signal indicating the temperature difference ΔT between the temperature of the heat reception plate 3 detected by the second temperature sensor 9 and the temperature of the heat sink 4 detected by the first temperature sensor 8. The management computer 100 proceeds to step S23.

The management computer 100 causes the estimation unit 104 to estimate the state of the device M on the basis of the amount of change per unit time of the temperature difference ΔT calculated by the thermal load calculation unit 103 (step S23).

<Effects>

As described above, in the present embodiment, the amount of change per unit time of the temperature difference ΔT between the temperature of the heat reception plate 3 detected by the second temperature sensor 9 and the temperature of the heat sink 4 detected by the first temperature sensor 8 is calculated as a thermal load. According to the present embodiment, the state of the device M can be appropriately estimated on the basis of the amount of change per unit time of the temperature difference ΔT. According to the present embodiment, when a problem occurs in the device M and the entire system including the device M and appears as a temperature change of the device M, the state of the device M can be appropriately estimated. As described above, according to the present embodiment, a sudden change in the device M and the entire system including and the device M can be considered in the estimation of the state of the device M.

Third Embodiment

Figure 7:
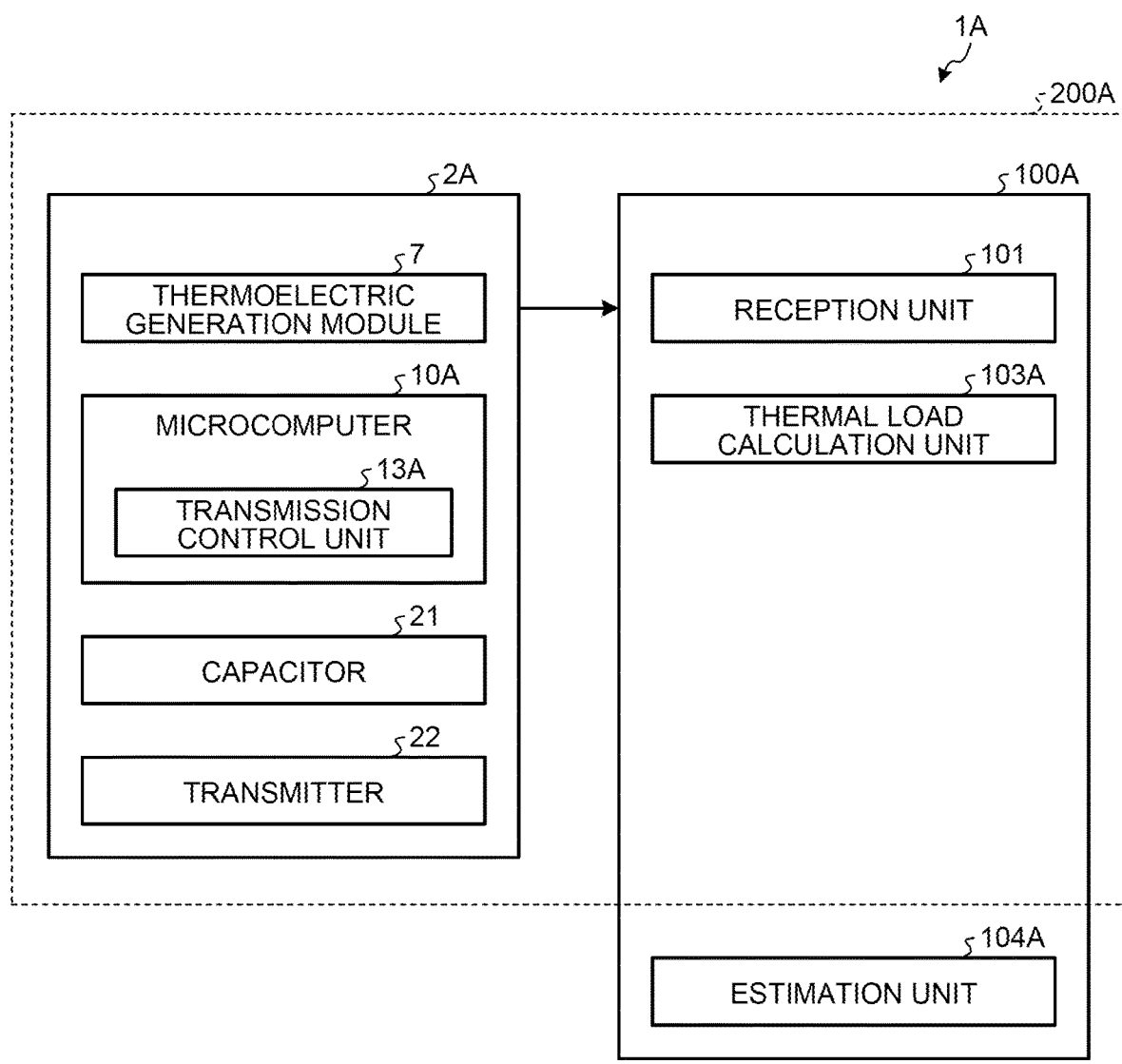
FIG. 7 is a block diagram illustrating a state estimation system according to a third embodiment.
Figure 8:
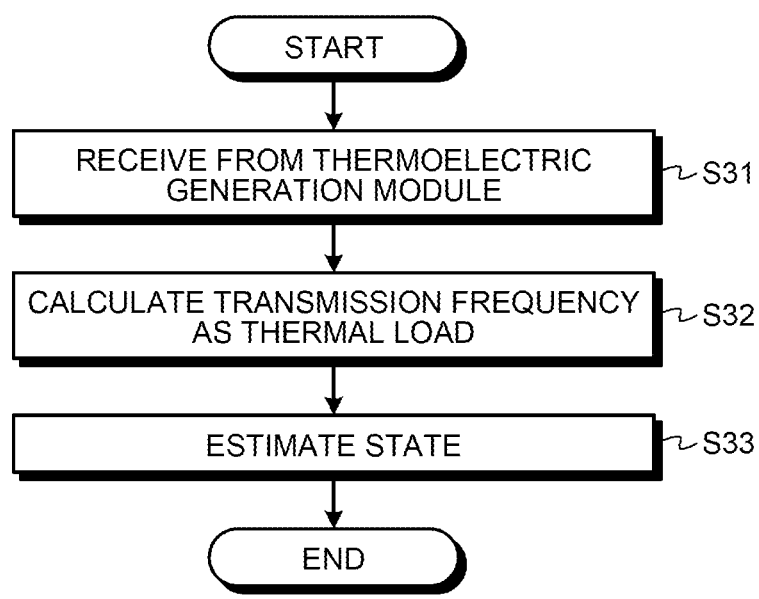
FIG. 8 is a flowchart illustrating an example of processing in a management computer of the state estimation system according to the third embodiment.

FIG. 7 is a block diagram illustrating a state estimation system 1A according to a third embodiment. FIG. 8 is a flowchart illustrating an example of processing in a management computer 100A of the state estimation system 1A according to the third embodiment. The third embodiment is different from the first embodiment in configurations of a thermoelectric generation device 2A and the management computer 100A.

<Thermoelectric Generation Device>

The thermoelectric generation device 2A includes a heat reception plate 3, a heat sink 4, a wall part 5, a heat transfer member 6, a thermoelectric generation module 7, a microcomputer 10A, a capacitor 21, a transmitter 22, and a substrate 31. The thermoelectric generation module 7, the capacitor 21, and the transmitter 22 of the thermoelectric generation device 2A function as a thermal load detection unit 200A together with a reception unit 101 and a thermal load calculation unit 103A of a management computer 100A described later.

The microcomputer 10A has a transmission control unit 13A. The transmission control unit 13A generates a transmission signal transmitted from the transmitter 22 when electric power stored in the capacitor 21 exceeds a predetermined amount to drive the transmitter 22. The transmission signal may be the same signal every time or may be a signal different for each transmission. For example, the transmission signal may include a current time, the number of transmissions, information for identifying the thermoelectric generation device 2A, and the like.

<Management Computer>

The management computer 100A includes a reception unit 101, a thermal load calculation unit 103A, and an estimation unit 104A.

The thermal load calculation unit 103A calculates a transmission frequency, which is the number of times of transmission per unit time of the transmitter 22, as the thermal load of the device M on the basis of the number of times the reception unit 101 receives data from the transmitter 22 of the thermoelectric generation device 2A.

As described above, the thermoelectric generation module 7 generates electric power by generation of the temperature difference ΔT between the heat reception plate 3 and the heat sink 4. The capacitor 21 stores the electric charge generated from the thermoelectric generation module 7, and drives the transmitter 22 when the stored electric power exceeds a predetermined amount. Thus, the transmission frequency of the transmitter 22 increases as the thermal load of the device M increases. That is, when the thermal load of the device M changes, the transmission frequency changes. Further, a high transmission frequency indicates that the temperature difference ΔT is large. In this manner, the transmission frequency changes according to the temperature difference ΔT.

The estimation unit 104A estimates the state of the device M on the basis of the transmission frequency of the transmitter 22 of the thermoelectric generation device 2A calculated by the thermal load calculation unit 103A.

For example, the estimation unit 104A estimates the state of the device M to be "defective (with a rapid temperature change)" when the transmission frequency of the transmitter 22 is equal to or more than the threshold, and estimates the state of the device M to be "good" when the transmission frequency of the transmitter 22 is less than the threshold.

<Processing of Management Computer>

Next, an example of processing of the management computer 100A will be described with reference to FIG. 8.

The management computer 100A receives data from the thermoelectric generation device 2A by the reception unit 101 (Step S31). The management computer 100A proceeds to step S32.

The management computer 100A calculates, by the thermal load calculation unit 103A, the transmission frequency from the transmitter 22 of the thermoelectric generation device 2A as the thermal load of the device M (step S32). More specifically, by the thermal load calculation unit 103A, the frequency at which the reception unit 101 receives data from the transmitter 22 of the thermoelectric generation device 2A, in other words, the transmission frequency at which the transmitter 22 of the thermoelectric generation device 2A transmits data is calculated as the thermal load of the device M. The management computer 100A proceeds to step S33.

The management computer 100A estimates the state of the device M by the estimation unit 104A on the basis of the transmission frequency at which the transmitter 22 of the thermoelectric generation device 2A has transmitted the data, which is calculated by the thermal load calculation unit 103A (step S33).

<Effects>

As described above, the present embodiment includes the thermoelectric generation module 7, the capacitor 21 that stores electric charge generated from the thermoelectric generation module 7, the transmitter 22 that is driven by discharge from the capacitor 21, and the thermal load calculation unit 103A that calculates a transmission frequency of the transmitter 22 as the thermal load of the device M, which function as the thermal load detection unit 200A. The estimation unit 104A estimates the state of the device M on the basis of the transmission frequency of the transmitter 22 calculated by the thermal load calculation unit 103A. According to the present embodiment, the state of the device M can be appropriately estimated on the basis of the transmission frequency of the transmitter 22. According to the present embodiment, a rapid change in the device M and the entire system including the device M can be considered in estimation of the state of the device M.

Modification Example

In each of the above-described embodiments, the microcomputer 10 may have the function of the management computer 100.

In the above-described first and second embodiments, the thermoelectric generation device 2 is described to detect the temperature of the device M and transmit the detected detection data, but is not limited thereto. A temperature sensor that is driven by electric power supplied from a power source or a battery, and a transmitter that is driven by electric power supplied from the power source or the battery and transmits detection data to the management computer 100 in a wired manner may be used.

In each of the above-described embodiments, the processing unit 12 of the thermoelectric generation device 2 is described to generate a transmission signal indicating the temperature difference ΔT between the temperature of the heat reception plate 3 detected by the second temperature sensor 9 and the temperature of the heat sink 4 detected by the first temperature sensor 8, and transmit the transmission signal indicating the temperature difference ΔT from the thermoelectric generation device 2 to the management computer 100, but is not limited thereto. The processing unit 12 of the thermoelectric generation device 2 may generate a transmission signal indicating each piece of detection data of the first temperature sensor 8 and the second temperature sensor 9 and transmit the transmission signal to the management computer 100, and the temperature data acquisition unit 102 of the management computer 100 may calculate the temperature difference ΔT from each piece of acquired detection data.

The invention claimed is:

1. A state estimation system comprising:
   a thermal load detection unit configured to detect a thermal load of an object; and
   an estimation unit configured to estimate a state of the object based on the thermal load of the object detected by the thermal load detection unit,
   wherein the thermal load detection unit includes:
      a thermoelectric generation module configured to generate electric power by a temperature difference between a temperature of the object and a temperature around the object,
      a power storage unit configured to store electric charge generated from the thermoelectric generation module, and
      a transmission unit configured to be driven by discharge from the power storage unit.

2. The state estimation system according to claim 1, wherein the thermal load detection unit is configured to detect, as the thermal load, an integrated amount of the temperature difference between the temperature of the object and the temperature around the object.

3. The state estimation system according to claim 1, wherein the thermal load detection unit is configured to detect, as the thermal load, an amount of change per unit time in the temperature difference between the temperature of the object and the temperature around the object.

4. The state estimation system according to claim 1, wherein the thermal load detection unit further includes:
- a temperature sensor that is configured to detect the temperature of the object; and
- a thermal load calculation unit that is configured to calculate a thermal load of the object based on the temperature of the object detected by the temperature sensor, and
- wherein the estimation unit is configured to estimate the state of the object based on the thermal load calculated by the thermal load calculation unit.

5. A state estimation system comprising:
- a thermal load detection unit configured to detect a thermal load of an object; and
- an estimation unit configured to estimate a state of the object based on the thermal load of the object detected by the thermal load detection unit,
- wherein the thermal load detection unit includes:
  - a thermoelectric generation module configured to generate electric power by a temperature difference between a temperature of the object and a temperature around the object,
  - a power storage unit configured to store electric charge generated from the thermoelectric generation module,
  - a transmission unit configured to be driven by discharge from the power storage unit, and
  - a thermal load calculation unit configured to calculate a transmission frequency of the transmission unit as a thermal load of the object, and
- wherein the estimation unit is configured to estimate the state of the object based on the transmission frequency of the transmission unit calculated by the thermal load calculation unit.

* * * * *